(12) United States Patent
Atwater et al.

(10) Patent No.: US 9,825,193 B2
(45) Date of Patent: Nov. 21, 2017

(54) PHOTON AND CARRIER MANAGEMENT DESIGN FOR NONPLANAR THIN-FILM COPPER INDIUM GALLIUM DISELENIDE PHOTOVOLTAICS

(71) Applicant: CALIFORNIA INSTITUTE OF TECHNOLOGY, Pasadena, CA (US)

(72) Inventors: Harry A. Atwater, South Pasadena, CA (US); Dennis Callahan, Los Angeles, CA (US); Colton Bukowsky, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 31 days.

(21) Appl. No.: 14/875,605

(22) Filed: Oct. 5, 2015

(65) Prior Publication Data
US 2016/0111563 A1    Apr. 21, 2016

Related U.S. Application Data

(60) Provisional application No. 62/155,997, filed on May 1, 2015, provisional application No. 62/060,436, filed on Oct. 6, 2014.

(51) Int. Cl.
| H01L 31/0216 | (2014.01) |
| H01L 31/0236 | (2006.01) |
| H01L 31/0392 | (2006.01) |
| H01L 31/054 | (2014.01) |
| H01L 31/0749 | (2012.01) |
| H01L 31/056 | (2014.01) |

(52) U.S. Cl.
CPC .. *H01L 31/03923* (2013.01); *H01L 31/02167* (2013.01); *H01L 31/02363* (2013.01); *H01L 31/02366* (2013.01); *H01L 31/054* (2014.12); *H01L 31/056* (2014.12); *H01L 31/0749* (2013.01); *Y02E 10/52* (2013.01); *Y02E 10/541* (2013.01)

(58) Field of Classification Search
None
See application file for complete search history.

(56) References Cited

U.S. PATENT DOCUMENTS

| 5,482,570 | A | * | 1/1996 | Saurer | H01G 9/2036 |
| | | | | | 136/255 |
| 2005/0056312 | A1 | * | 3/2005 | Young | H01L 31/0749 |
| | | | | | 136/258 |
| 2005/0098204 | A1 | | 5/2005 | Roscheisen et al. | |

(Continued)

OTHER PUBLICATIONS

B. Vermang, et al., "Improved rear surface passivation of Cu(In,Ga)Se2 solar cells: A combination of an Al2O3 rear surface passivation layer and nanosized local rear point contacts", IEEE Journal of Photovoltaics 4(1) p. 486-492 (2014).*

(Continued)

*Primary Examiner* — Eric R Smith
(74) *Attorney, Agent, or Firm* — Steinfl + Bruno LLP (57) ABSTRACT

Photovoltaic structures are disclosed. The structures can comprise randomly or periodically structured layers, a dielectric layer to reduce back diffusion of charge carriers, and a metallic layer to reflect photons back towards the absorbing semiconductor layers. This design can increase efficiency of photovoltaic structures. The structures can be fabricated by nanoimprint.

8 Claims, 6 Drawing Sheets

(56) References Cited

U.S. PATENT DOCUMENTS

| | | | |
|---|---|---|---|
| 2010/0139758 A1* | 6/2010 | Chang | H01L 31/0236 136/256 |
| 2010/0178716 A1* | 7/2010 | Zapalac | H01L 31/0392 438/4 |
| 2010/0240167 A1 | 9/2010 | Dasgupta et al. | |
| 2010/0288351 A1* | 11/2010 | Speit | C03C 3/112 136/256 |
| 2010/0313951 A1 | 12/2010 | Nalamasu et al. | |
| 2011/0061730 A1 | 3/2011 | Boyer, Jr. | |
| 2011/0277827 A1* | 11/2011 | Yang | B82Y 20/00 136/255 |
| 2012/0006399 A1 | 1/2012 | Van Erven | |
| 2012/0204939 A1* | 8/2012 | Lee | H01L 31/0749 136/249 |
| 2013/0000722 A1* | 1/2013 | Yamada | H01L 31/02363 136/256 |
| 2013/0125983 A1* | 5/2013 | Weiss | H01L 31/056 136/259 |
| 2014/0209161 A1* | 7/2014 | Sang | H01L 31/02363 136/256 |
| 2015/0114458 A1* | 4/2015 | Cheng | H01L 31/0322 136/256 |

OTHER PUBLICATIONS

Kelzenberg, M. D. et al. *Enhanced Absorption and Carrier Collection in Si Wire Arrays for Photovoltaic Applications.* Nature Materials Letters. Mar. 2010, vol. 9. pp. 239-244 + Correction from Nat. Mater. (1 page).
Campbell, P. et al. *Light Trapping Properties of Pyramidally Textured Surfaces.* J. Appl. Phys. Jul. 1987, vol. 62, No. 1, pp. 243-249.
Yablonovitch, E. *Statistical Ray Optics.* J. Opt. Soc. Am. Jul. 1982, vol. 72, No. 7, pp. 899-907.
Deckman, H. W. et al. *Optically Enhanced Amorphous Silicon Solar Cells.* Appl. Phys. Lett. Jun. 1983, vol. 42, pp. 968-970.
Müller, J. et al. *TCO and Light Trapping in Silicon Thin Film Solar Cells.* Sol. Energy. Apr. 2004, vol. 77, pp. 917-930.
Grandidier, J. et al. *Solar Cell Efficiency Enhancement via Light Trapping in Printable Resonant Dielectric Nanosphere Arrays.* Phys. Status Solidi. Nov. 2012 (online), 210, pp. 255-260.
Colin, C. et al. *Broadband Light-Trapping in Ultra-Thin Nano-Structured Solar Cells.* Proc. of SPIE. Mar. 2013, vol. 8620, pp. 86200C-1-12.
van Lare, C. et al. *Light Coupling and Trapping in Ultrathin Cu(In,Ga)Se 2 Solar Cells Using Dielectric Scattering Patterns.* ACS Nano Sep. 2015, pp. A-K. 11 pages.
Callahan, D. et al. *Light Trapping in Ultrathin Silicon Photonic Crystal Superlattices with Randomly-Textured Dielectric Incouplers.* Opt. Express. Dec. 2013, vol. 21, No. 25, pp. 30315-30326.
Ferry, V. E. et al. *Modeling Light Trapping in Nanostructured Solar Cells.* ACS Nano Nov. 2011, vol. 5, No. 12, pp. 10055-10064.
Deceglie, M. G. et al. *Design of Nanostructured Solar Cells Using Coupled Optical and Electrical Modeling.* Nano Letters May 2012, 12, pp. 2894-2900.
Li, X. et al. *Bridging Electromagnetic and Carrier Transport Calculations for Three-Dimensional Modelling of Plasmonic Solar Cells.* Optics Express Jul. 2011, vol. 19 Suppl. 4.
Abràmoff, M. D. et al. *Image Processing with imageJ.* Biophotonics International, Jul. 2004, 7 pages.
Lumerical Solutions, Inc. http://www.lumerical.com/tcad-products/fdtd/ downloaded from the internet Dec. 8, 2015. (n.d.) 2 pages.
Alonso, M. I. et al. *Optical Functions of Chalcopyrite CuGa X In 1-X Se 2 Alloys.* Appl. Phys. A Mater. Sci. Process. May 2002, vol. 74, No. 5, pp. 659-664.
"TCAD Sentaurus," (n.d.) [Online]. 2012 Available: http://www.synopsys.com. 4 pages.
Repins, I. et al. *Required Material Properties for High-Efficiency CIGS Modules.* Proc. of SPIE. vol. 7409. Aug. 2009, pp. 74090M-1-14.
Dahan, N. et al. *Optical Approaches to Improve the Photocurrent Generation in Cu(In,Ga)Se2 Solar Cells with Absorber Thicknesses down to 0.5 Mm.* J. Appl. Phys. Nov. 2012, vol. 112, pp. 094902-1-094902-7.
Gloeckler, M. et al. *Numerical Modeling of CIGS and CdTe Solar Cells: Setting the Baseline.* In Proceedings of 3rd World Conference on Photovoltaic Energy Conversion, IEEE, May 2003, pp. 491-494.
Contreras, M. et al. *Optimization of CBD CdS Process in High-Efficiency Cu(In,Ga)Se2-Based Solar Cells.* In Thin Solid Films, Feb. 2002, vol. 403-404, pp. 204-211.
Naghavi, N. et al. *Buffer Layers and Transparent Conducting Oxides for Chalcopyrite Cu(In,Ga)(S,Se)2 Based Thin Film Photovoltaics: Present Status and Current Developments.* Prog. Photovoltaics Res. Appl. Apr. 2010, 18, pp. 411-433.
Stanbery, B. J. *Copper Indium Selenides and Related Materials for Photovoltaic Devices.* Crit. Rev. Solid State Mater. Sci. Jun. 2002, vol. 27, No. 2, pp. 73-117.
Vermang, B. et al. *Development of Rear Surface Passivated Cu(In,Ga)Se2 Thin Film Solar Cells with Nano-Sized Local Rear Point Contacts.* Sol. Energy Mater. Sol. Cells Aug. 2013, vol. 117, pp. 505-511.
Verschuuren, M. A. *Substrate Conformal Imprint Lithography for Nanophotonics*, Utrecht University, Mar. 2010. (150 pages in two parts).
Verschuuren, M. et al. *3D Photonic Structures by Sol-Gel Imprint Lithography.* MRS Proc. Apr. 2007, 1002, 6 pages.
Kelzenberg, M. D. *Appendix B: Silicon Microwire Photovoltaics*, California Institute of Technology, May 2010. 41 pages.
van Lare, C. et al. *Dielectric Scattering Patterns for Efficient Light Trapping in Thin-Film Solar Cells.* Nano Lett. Jun. 2015, vol. 15, pp. 4846-4852.
Wang, P. et al. *Optimization of Periodic Nanostructures for Enhanced Light-Trapping in Ultra-Thin Photovoltaics.* Opt. Express Mar. 2013, vol. 21, No. 5, pp. 6274-6285.
Du, Q. G. et al. *Enhanced Optical Absorption in Nanopatterned Silicon Thin Films with a Nano-Cone-Hole Structure for Photovoltaic Applications.* Opt. Lett. Apr. 2011, vol. 36, No. 9, pp. 1713-1715.
Oskooi, A. et al. *Partially Disordered Photonic-Crystal Thin Films for Enhanced and Robust Photovoltaics.* Appl. Phys. Lett. May 2012, vol. 100, pp. 181110-1-4.
Ji, L. et al. *Highly Ordered Nano-Cone Back Reflector Arrays for Ultra-Thin High Performance CIGS Cells.* 2013 IEEE 39th Photovoltaic Specialists Conference (PVSC), IEEE, Jun. 2013, pp. 1977-1979.
Yang, L. et al. *Optimal Design of Ultra-broadband, Omnidirectional,and Polarization-insensitive Amorphous Silicon Solar Cells with a Core-shell Nanograting Structure.* Prog. Photovoltaics: Research and Applications vol. 21, Apr. 2012, pp. 1077-1086.
Fountaine, K. T. et al. *Mesoscale Modeling of Photoelectrochemical Devices: Light Absorption and Carrier Collection in Monolithic, Tandem, Si\WO_3 Microwires.* Opt. Express Oct. 2014, vol. 22, No. S6, pp. A1453-A1461.
Gloeckler, M. et al. *Potential of Submicrometer Thickness Cu(In,Ga)Se [sub 2] Solar Cells.* J. Appl. Phys. Nov. 2005, vol. 98, pp. 103703-1-7.
Bernardi, M. et al. *Extraordinary Sunlight Absorption and One Nanometer Thick Photovoltaics Using Two-Dimensional Monolayer Materials*, Nano Lett. Jun. 2013, vol. 13, pp. 3664-3670.
Spinelli, P. et al. *Al2O3/TiO2 nano pattern antireflection coating with ultralow surface Recombination.* Applied Physics Letters, Jun. 2013, vol. 102, pp. 233902-1-4.
International Search Report and Written Opinion for International Application No. PCT/US2015/054090 filed Oct. 5, 2015 on behalf of California Institute of Technology, dated Jan. 22, 2016. 12 pages.

\* cited by examiner

PHOTON AND CARRIER MANAGEMENT DESIGN FOR NONPLANAR THIN-FILM COPPER INDIUM GALLIUM DISELENIDE PHOTOVOLTAICS

CROSS REFERENCE TO RELATED APPLICATIONS

The present application claims priority to US Provisional Patent Application No. 62/060,436, filed on Oct. 6, 2014, and US Provisional Patent Application No. 62/155,997, filed on May 1, 2015, the disclosure of each of which is incorporated herein by reference in its entirety.

STATEMENT OF INTEREST

This invention was made with government support under Grant No. DE-EE0004946/T-107934 awarded by the Department of Energy. The government has certain rights in the invention.

TECHNICAL FIELD

The present disclosure relates to photovoltaics. More particularly, it relates to photon and carrier management design for nonplanar thin-film copper indium gallium diselenide photovoltaics.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

SUMMARY

In a first aspect of the disclosure, a photovoltaic structure is described, the photovoltaic structure comprising: a metallic layer; a copper indium gallium diselenide (CIGS) layer on the metallic layer; a CdS layer on the CIGS layer, conformal to the CIGS layer; and an Al-doped ZnO layer on the CdS layer.

DETAILED DESCRIPTION

Nonplanar structured photovoltaic absorber structures have the potential to achieve high solar cell efficiency with a significantly reduced material use. The present disclosure describes optoelectronic structures that highlight photon and generated carrier management opportunities for improvement of thin film $Cu(In_xGa_{1-x})Se_2$ (CIGS) device performance. Structures realized via either self-assembly or patterning via nanoimprint lithography, and also a combination of both are described to exhibit increases in short circuit current density and open circuit voltage by up to 4 mA/cm$^2$ and about 25 mV, respectively. The structures investigated include: 1) self-assembled nonplanar structures that strongly scatter incident light and enhance carrier generation near regions of high electric potential 2) lithographically patterned embedded periodic dielectric structures 3) planar dielectric layers that separate the CIGS absorber from the molybdenum back contact via point contacts that minimize optical and electronic losses 4) a combination of the above features for combined effects. It is found that the self-assembled nonplanar CIGS cells with 700 nm planar equivalent thickness, combined with dielectric layers separation layers yield simulated efficiencies of 18.3% or greater, compared with 15.3% predicted efficiency for planar CIGS thin film cells of equivalent thickness.

Light management by incorporation of randomly textured cell microstructures or nanostructures has been extensively investigated for crystalline silicon, amorphous silicon, and GaAs photovoltaics (see Refs. [1-6]) but such approaches have not been as extensively applied to polycrystalline thin-film compound materials and devices, such as CIGS, CdTe, and $Cu_2ZnSnS_4$, see Refs. [1-2]. In the present disclosure, light management approaches are applied to CIGS photovoltaic device design and demonstrate, via optoelectronic simulations, opportunities for improvement to both the short-circuit current density ($J_{SC}$) and open circuit voltage ($V_{OC}$).

Many studies of light management in photovoltaics and solar cell architectures have focused on increased light absorption as a design objective with important implications, see Refs. [1-2]. As a first approximation, this type of analysis gives a qualitative indication of how light management can increase cell efficiency. However, coupled optoelectronic modeling in which both full-field electromagnetic simulation of light absorption and scattering is combined with detailed carrier generation, transport, and recombination models results in a more complete picture, see Refs. [1-2]. Accurate modeling of the spatial distribution of generated carriers is important, in addition to increasing overall absorption because ultimately, the charge carrier collection efficiency directly affects photovoltaic efficiency. Only a full optoelectronic model has the capabilities to quantitatively relate optical absorption enhancement, electronic transport, and photocurrent density enhancement, and can highlight electronic transport issues which can be overcome by improved optical design. For example, the present disclosure describes that randomly textured CIGS absorbers can absorb the majority of the incident spectrum in a film of 700 nm planar equivalent thickness, but generated carriers are lost to parasitic recombination in certain areas. Strategies to overcome these issues are described, as well other light trapping methods for CIGS devices grown via more conventional film synthesis processes. Possible CIGS device architectures are described that enable thinning of the CIGS absorber layer to an equivalent thickness of 700 nm while maintaining or improving the $J_{SC}$ and/or the $V_{OC}$ compared to those of thicker planar devices.

Optical Analysis of CIGS Absorbers.

Randomly-textured CIGS thin film photovoltaic absorbers can exhibit a complex random film topology that results from a Cu and Se flux assisted re-crystallization process, leading to grain coalescence and coarsening as well as void formation via reactive mass transport, see Ref [13]. Cross-sectional scanning electron microscope (SEM) images of these absorber films were used to construct models for optoelectronic simulations aimed at identifying mechanisms of light trapping. A representative cross-sectional image can be seen in FIG. 1, panel a, which illustrates a CIGS film (105) with equivalent planar thickness of 1.7 micrometers. This cross section was contrast-thresholded and filtered with imaging software to create a digital representation of the film, see Ref. [14]. The device schematic in FIG. 1, panel b, illustrates a simulated device structure (110) that utilizes this absorber film morphology. The device cross section in FIG. 1, panel b, includes a 50 nm CdS conformal window layer (115), contacted to a CIGS absorber layer (120) to simulate device structure resulting from conformal bath deposition. Voids (125) which occur naturally during the recrystallization process are included in the model, and are consistent with the film morphologies observed in cross-sectional SEM micrographs. The CdS layer (115) is coated with a 150 nm aluminum-doped zinc oxide (AZO, 130) that fills the remainder of the volume and serves as a transparent front contact. The back contact consists of a 500 nm molybdenum (Mo, 135) planar thin film.

Figure 1:
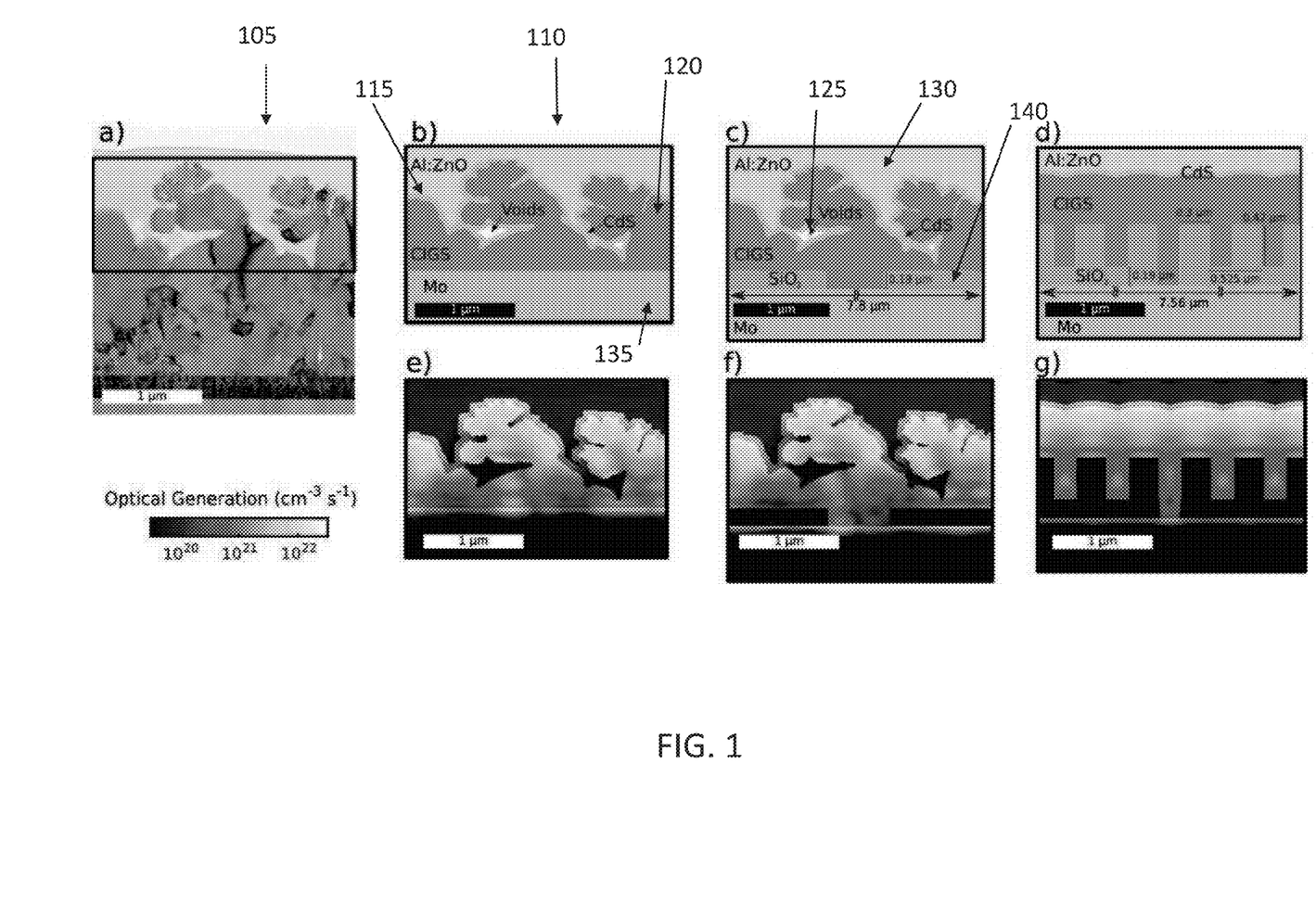
FIG. 1 illustrates a representative cross section of microstructured CIGS absorber films.

FIG. 1 panel a illustrates a representative focused ion beam (FIB) cross section of microstructured CIGS absorber films is used to define the photovoltaic model for a Mo back contact device, shown in panel b. In panel c, a $SiO_2$ layer (140) serves to increase reflection and define electrical point contacts, enhancing CIGS film passivation. Panel d shows a periodic CIGS photonic structure defined by deposition on a patterned $SiO_2$ layer with electrical point contacts. The optical generation profiles, weighted by the AM-1.5 G solar spectrum, for devices simulated in panels b, c, and d are shown in panels e, f, and g.

Exemplary devices cross sections, such as in FIG. 1 panel b, were rendered for full field electromagnetic simulations in two dimensions with periodic boundary conditions, see Ref. [15]. Electromagnetic simulations using the finite-difference time-domain (FDTD) method were performed with normally incident plane wave illumination; all optical quantities reported here were obtained as polarization averages of the transverse electric and transverse magnetic responses for the films. The absorbed fraction of the incident solar spectrum was constructed from a set of single frequency electromagnetic simulations that were then power-weighted by the spectral irradiance of the ASTM-AM1.5 G solar spectrum. The fractional gallium composition of these absorbers is close to x=0.4, and refractive index data for this composition was used to construct the complex dielectric function for CIGS absorbers in electromagnetic simulations, see Ref [16]. The power absorbed in each material can be calculated from the electric field magnitude and complex refractive index at each mesh point in the simulation. The optical generation rate $G_{opt}$ is calculated by $$G_{opt}(\vec{r}, \lambda) = \frac{\varepsilon'' |E(\vec{r}, \lambda)|^2}{2\hbar}$$

where $\varepsilon''$ is the imaginary part of the complex refractive index, E is the electric field, $\vec{r}$ is the position vector, $\lambda$ is the wavelength, and h is Planck's constant, see Refs. [7,10]. Spatial maps of charge carrier generation are then used as inputs into a device physics simulation, see Ref [17]. This method is general and can be used for any arbitrarily-shaped two-dimensional device cross-section. Absorption in the randomly textured CIGS films was compared to planar thin films (not shown), CIGS films with dielectric spacer layers (FIG. 1 panel c), and CIGS films deposited onto periodic dielectric structures (FIG. 1 panel d). In FIG. 1, panels c and d show only a subset of the larger structure periodicity defined by point contacts, with contact periodicity of 7.8 μm and 7.56 μm respectively. In FIG. 1, panels f and g depict the total optical generation those structures, respectively.

Absorption in Self-Assembled Randomly Textured CIGS Films.

Figure 2:
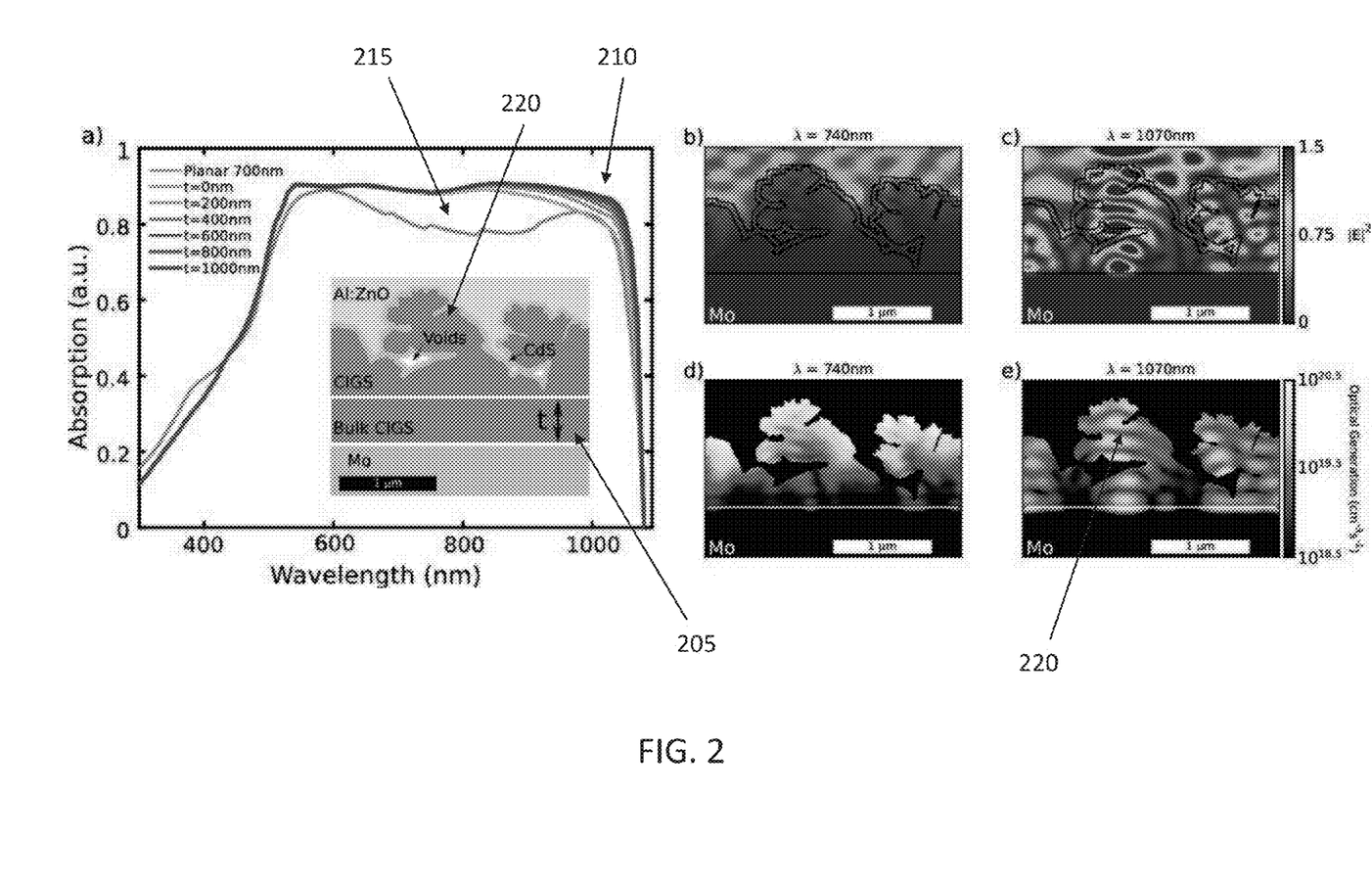
FIG. 2 shows absorption for varying thicknesses of randomly textured absorbers along with TE and TM averaged electric field intensity, and the corresponding optical generation rates.

From the generation map of FIG. 1 panel e, two results can be seen from the full field electromagnetic simulation: (1) photocarrier generation hotspots in the CIGS absorber, and (2) areas of parasitic absorption in surrounding layers. Areas of high carrier generation are generally close to the randomly-textured CdS/CIGS film interface. The randomly-textured CIGS surface layer absorbs most of the incident light, suggesting that the underlying thickness of CIGS film beneath the surface topology in panel a could be superfluous with respect to light absorption. In FIG. 2, panel a shows results for a series of randomly-textured CIGS structures with varying underlying film thickness, t (205), from 0 to 1 micrometer. Typically in CIGS photovoltaics, absorbing layers are on the order of 2-3 micrometers in thickness, see Ref [18]. The thickest film simulated in FIG. 2 panel a corresponds to addition of a 1 micrometer layer of underlying CIGS material, illustrated by line (210) with the greatest absorption, resulting in a CIGS device with a planar equivalent thickness of 1.7 μm, which is close to the typical absorber thickness for CIGS. In other words, the textured layer has a higher absorption than a thicker planar layer. The high normalized absorption of the randomly textured CIGS device is remarkably constant across the visible and near infrared spectrum above the CIGS bandgap. As the underlying CIGS film thickness is varied from 1 micrometer to zero, the reduction in absorbed photocurrent in CIGS less than 3%. This result indicates an exceptional ability of randomly textured CIGS film structures to efficiently scatter and/or absorb light reflected or transmitted by a planar device with equivalent 700 nm CIGS thickness, represented as curve (215).

FIG. 2 panels b and c show TE and TM averaged electric field intensity, $|E|^2$, profiles at $\lambda$=740 nm and $\lambda$=1070 nm, and FIG. 2 panels d and e show the corresponding optical generation rates. These profiles indicate strong light scattering and absorption by the randomly textured CIGS films. Absorption in the planar device begins to decline at wavelengths beyond about $\lambda$=600 nm due to increasing reflection, while FIG. 2 panels b and d indicated that randomly textured CIGS absorbers exhibit decreased absorption at $\lambda$=740 nm. At this wavelength, the randomly textured CIGS begins to transmit light, and a non-zero thickness for the underlying CIGS layer is required for full absorption. In regions of the spectrum where light reaches the Mo back contact, it is parasitically dissipated in the metal. The significant absorption loss in the Mo is due to its refractive index being relatively well-matched to CIGS, leading to a low reflectivity interface, see Refs. [6,19]. Desirably, the metal back contact in a solar cell should be designed to serve as a good back reflector to enable multi-pass absorption, in addition to forming an electrical contact. While Mo is useful as a low work function barrier contact to CIGS, the CIGS/Mo interface is an undesirable optoelectronic structure.

Furthermore, FIG. 2 panels c and e indicate field intensity enhancement in the lobes of the CIGS randomly textured structure; these lobes are characterized by their location above a void (220). The sharp refractive index contrast at the CIGS/CdS/void interface provides for efficient internal reflection back into the absorber layer. Thus these lobes effectively act as monolithically integrated low Q resonators. Importantly, these lobes are also areas of high electric potential, meaning there is more generation in areas where charge will be collected by the junction.

Figure 3:
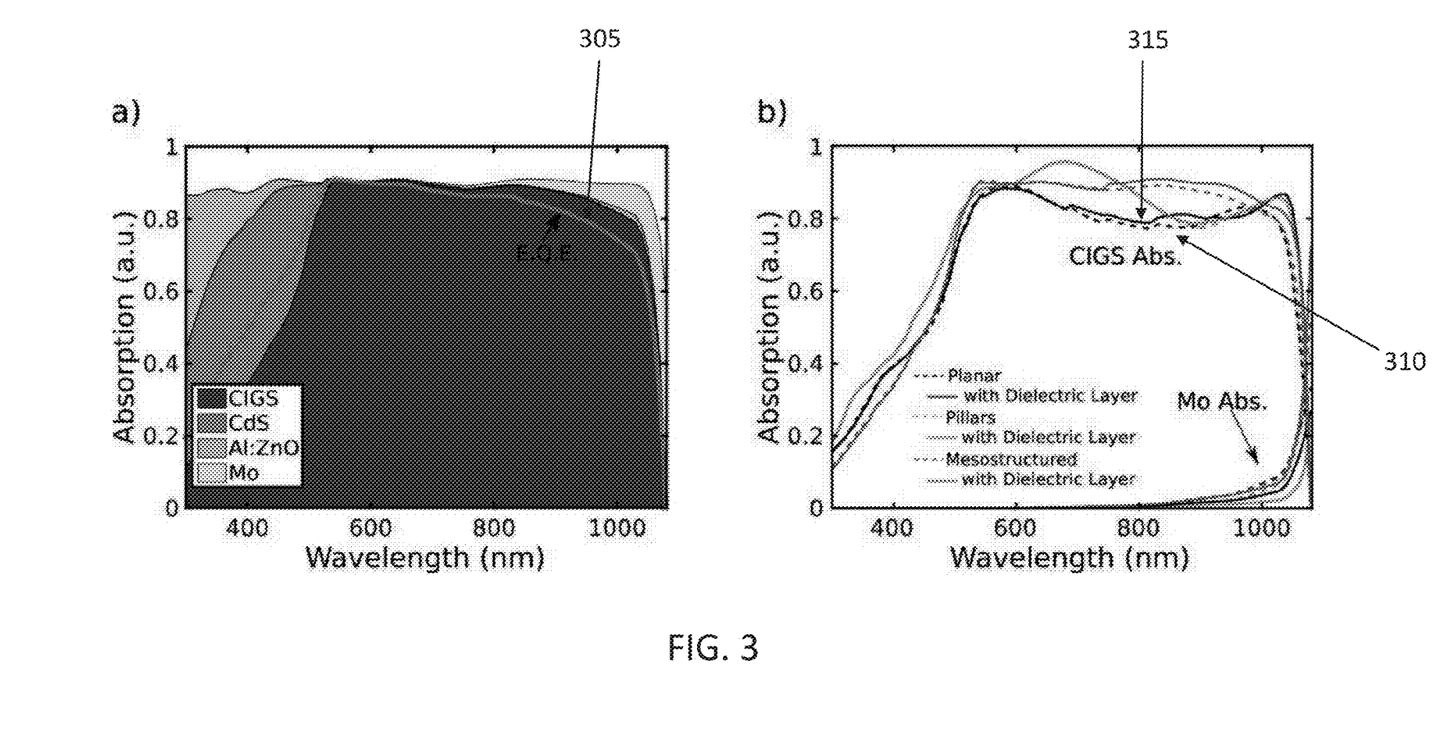
FIG. 3 shows the spectral absorption of various CIGS absorbers in different randomly textured/patterned configurations.

FIG. 3 panel a shows the spectral absorption of the randomly textured CIGS with no underlying planar CIGS film (as in FIG. 1 panel b), which aids the identification of opportunities for more efficient light management. The curve (305) overlaid onto the absorption spectra represents the external quantum efficiency (E.Q.E.) obtained from carrier transport simulations discussed below. The most significant fraction of absorption occurs in the CIGS layer. However CIGS absorption at shorter wavelengths is significantly diminished above the CdS window layer bandgap and also where interband transitions in the AZO give significant parasitic absorption. The parasitic absorption at shorter wavelengths is about 11% of the total incident above-bandgap photons (i.e., 4.4 mA-cm-2 photocurrent, at short-circuit). The majority of AZO absorption for randomly textured CIGS arises from the increased total AZO material required to make a conformal front contact. While light absorbed in the AZO are completely lost, the E.Q.E. curve shows that some carriers generated in the CdS window layer do contribute to the short circuit current. However, collection from the CdS is inefficient due to the high defect concentration in the window layer, see Ref. [20]. Thinning the AZO layer could incur increased resistive losses, and further thinning the CdS could also be detrimental, causing pin holes and shunts among other transport-related issues, see Refs. [18,21]. Use of wider band gap heterojunction window layer materials is a potential alternative to minimize photocurrent lost in CdS, and is currently under investigation, see Refs. [22,23]. The other loss mechanisms are reflection and absorption by the Mo back contact. Front surface reflection losses can be addressed by applying well-known 2-layer anti-reflection coatings and are not treated here. The loss in the Mo can be mitigated by appropriate design of dielectric reflector layers that also show promising electronic transport behavior, see Ref [24], as discussed below.

Dielectric Reflection Layers and Patterning.

Parasitic losses in the Mo are difficult to address for sub-micrometer thick absorber layers. However, these losses can be reduced by increasing reflectance at the CIGS/Mo interface. In order to increase reflectance at this interface, it has been proposed to introduce a dielectric layer and make point contacts with the Mo as shown in FIG. 1 panel e and FIG. 1 panel f, see Ref. [24]. To maximize the reflectance of this new dielectric interface, the dielectric layer has a low index and its thickness should be co-designed so as to expel electric field from itself and away from the Mo. As an example, low refractive index silica sol-gel (n=1.42) layers could be fabricated via nanoimprint lithography, see Refs. [25,26]. An optimum low refractive index layer thickness of about 190 nm was found from electromagnetic simulations designed to maximize the absorbed photocurrent. This low refractive index layer thickness maximizes its reflectance at $\lambda=1040$ nm. For planar thin film structures, this can be done using the transfer matrix method, but owing to the nonplanar film morphology discussed here partial spectral averaging was used to get an averaged response, which avoids thin film interference artifacts in the simulations, typically not seen in real films due to small, random thickness variations, see Ref [27].

FIG. 3 panel b demonstrates the reduction of parasitic Mo absorption and correspondingly increased CIGS absorption due to enhanced CIGS back interface reflectance for the structures depicted in FIG. 1 as well as a planar thin film. First, insertion of the low index layer into the structure increases absorption in a planar film slightly at wavelengths where the CIGS is optically thin, beginning around 750 nm where the dotted curve (310) diverges from the solid curve (315). However the largest boost in absorption is near the band edge, where the dielectric layer is designed to reflect light back into the CIGS absorber.

FIG. 3 panel a illustrates the absorption in a simulated randomly-textured device with a planar equivalent of 700 nm, indicated in each layer. In panel b, a comparison of CIGS and Mo absorption for different device structures is shown. Adding a dielectric reflection layer can boost CIGS absorption near the band edge by reducing Mo parasitic absorption.

Periodically ordered structures, such as an array of pillars, further improve upon the planar absorber. An exemplary optimized periodic structure with a period of 525 nm, a height of 420 nm, and feature width of 300 nm imparts a periodic structure to a conformally deposited CIGS absorber layer. This strongly increases CIGS absorption between 600 nm and 800 nm, corresponding to the maximum of solar photon flux. This periodic structure has similar anti-reflection properties as the randomly textured absorbers, where the surface texture preferentially scatters light into the absorber at these wavelengths, see Refs. [10,28]. The surface texture does not incouple additional light around 900 nm. Unlike the micro-structured absorber, a periodic structure can be controllably reproduced via methods such as nano-imprint lithography. Further addition of a dielectric reflection layer to the periodically ordered cell gives an additional absorption increase close to the band-edge. The overall absorption spectrum closely resembles a superposition of the effects from the two light trapping mechanisms, suggesting multiple strategies can be combined to achieve overall broadband enhancement. An antireflection coating tuned to about $\lambda=900$ nm would be beneficial in this case to further increase the absorption enhancement.

Lastly, combining a dielectric reflection layer with randomly textured CIGS absorbers does not result in the same absorption enhancement as in the lithographically patterned and planar films. This is attributed to the strong scattering of incident light inhibiting the destructive interference condition within the dielectric layer. However a modest broadband increase in absorption is seen at longer wavelengths where the CIGS absorber is optically thin. This could correspond to the fraction of light that is reflected back into the absorber at the CIGS/SiO$_2$ interface. The Mo absorption curves of the planar and ordered architectures demonstrate a clear decrease of parasitic absorption near the band edge, while showing little change in the Mo absorption for the randomly micro-structured case.

Carrier Transport Analysis for CIGS Absorbers.

The optical generation profiles for all structures depicted in FIG. 1 as well for planar films were used as inputs to carrier transport simulations that numerically calculated the steady state EQE and current density-voltage (JV) characteristics of each device. Previously reported transport parameters for CIGS photovoltaics were used, see Ref. [20]; exceptions to the use of these values are explicitly stated below. The planar device model matches quantitatively to previous reports, while with the more rigorous treatment of light absorption and local photocarrier generation rate provided by full field electromagnetic simulations, slightly lower short-circuit current densities and slightly lower open circuit voltages are obtained.

Randomly Textured Absorbers.

The absorbed photocurrent can be determined for optical structures with improved light management, such as the randomly textured CIGS absorbers described here, but the corresponding device transport and electrical performance cannot be predicted from optical models alone. Many authors of previous papers on optical modeling of photocurrent enhancement make constant assumptions regarding internal photocarrier collection efficiency, i.e., constant ratio of photons absorbed to electrons collected, see Refs. [29-32], and in some systems this assumption is well justified, see Refs. [10,33], while in others a fully coupled optoelectronic model gives more quantitatively accurate results, see Refs. [11,34]. In the present disclosure, a full combined optical simulation and carrier transport analysis (c.f., EQE curve in FIG. 3 panel a) indicates that photons and electrons are less efficiently collected at longer wavelengths in the randomly textured device. Minority electrons generated near the CIGS/Mo interface are swept to the back contact and recombine. This only occurs at longer wavelengths with correspondingly low absorption coefficients in the absorber.

Figure 4:
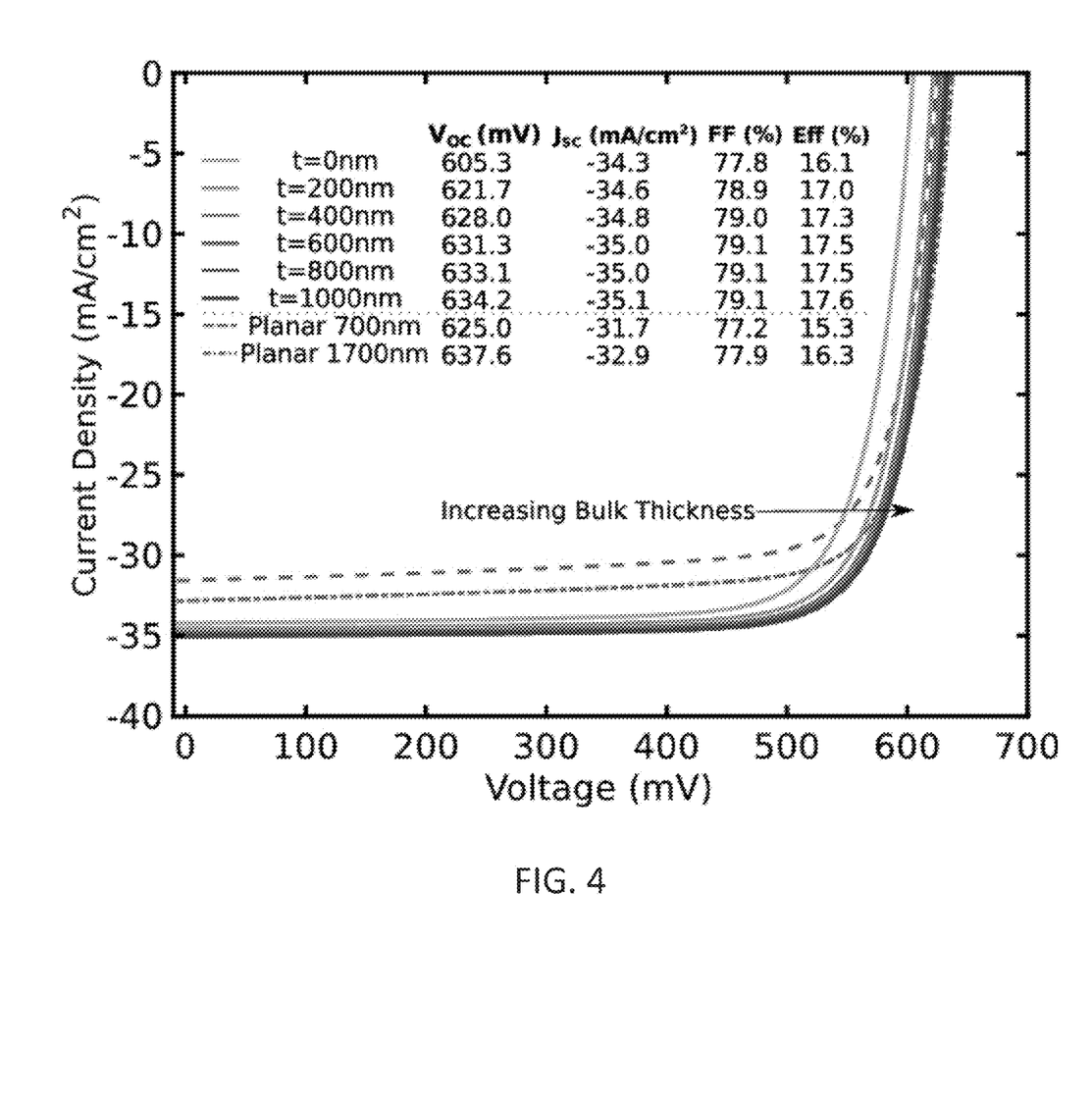
FIG. 4 illustrates simulated devices with varying bulk CIGS underlayer thickness.

The illuminated JV curves for increasing underlying CIGS film thickness are shown in FIG. 4 panel a. FIG. 4 illustrates simulated devices with varying CIGS underlayer thickness, t, (c.f., inset of FIG. 2 panel a). Open circuit voltage increases appreciably with increasing t, indicating less generation is lost to recombination at the back contact.

In FIG. 4 it can be seen that $J_{SC}$ does not significantly increase, as was predicted via the optical analysis, but $V_{OC}$ quickly increases, approaching a maximal value of 634.2 mV. The small increase in $J_{SC}$ alone cannot account for the substantial increase of the $V_{OC}$. The observed $V_{OC}$ gain is instead attributed to the spatial separation between carrier generation in thicker films from parasitic recombination at the back contact, giving minority carriers generated at depth a greater chance of diffusing to the areas of space charge region near the diode junction, see Ref. [35]. The minority carrier diffusion length is about 700 nm for the mobilities used here, and for sufficiently thick CIGS films, the majority of photogenerated carrier are at least this distance from the back contact, so recombination is reduced and $V_{OC}$ is maximized. The surface recombination velocity in these simulations is set to the thermal velocity of electrons and represents a worst-case scenario. Here, the $V_{OC}$ of a randomly textured device with 1 micrometer of underlying CIGS shows a slightly diminished $V_{OC}$ compared to a planar device of the equivalent 1.7 micrometers of material as expected from increasing the junction area, and therefore recombination sites.

Dielectric Layers and Patterns.

Figure 5:
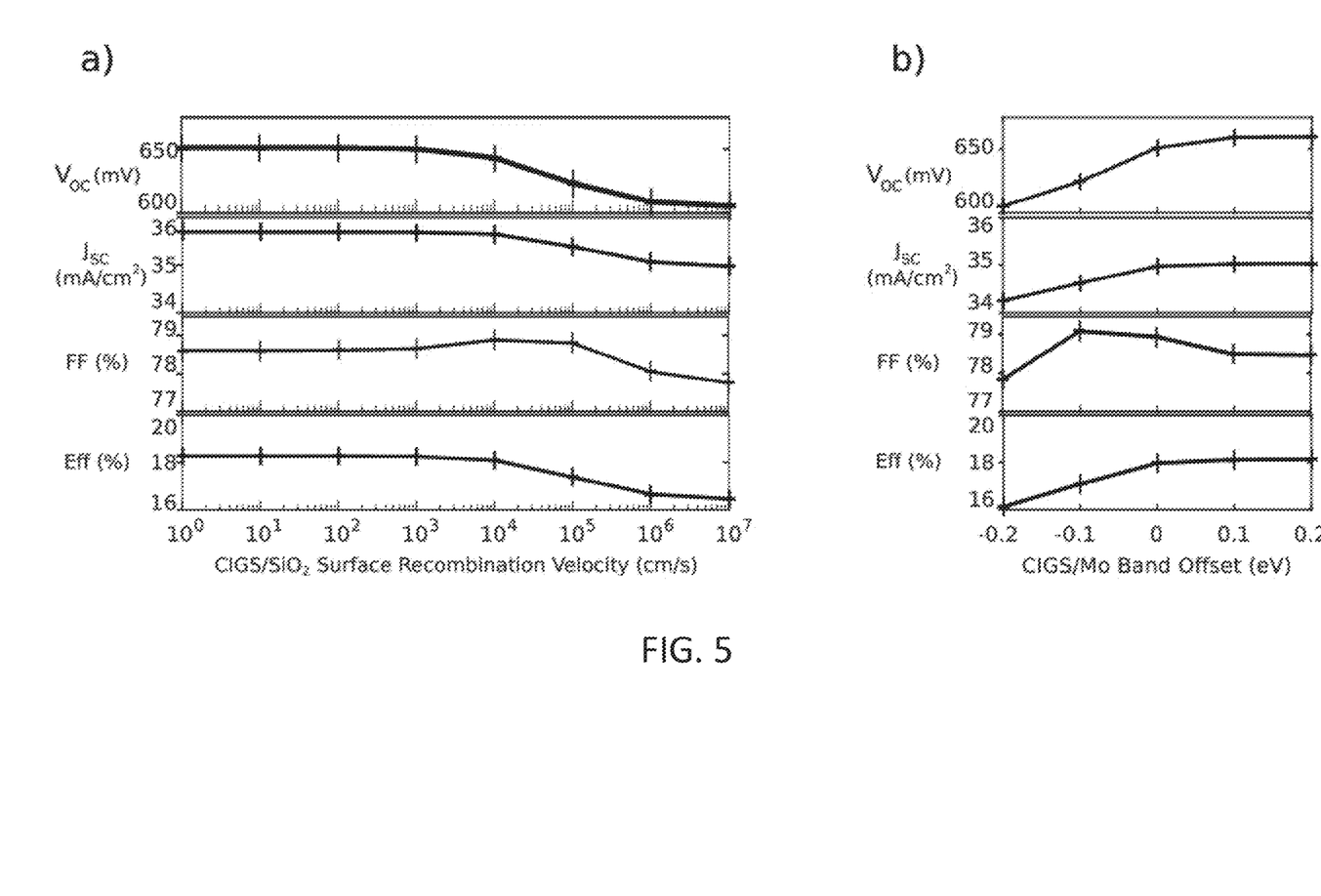
FIG. 5 illustrates $V_{OC}$, $J_{SC}$, fill factor, and efficiency of simulated randomly textured devices with dielectric layers and with varying band offsets at the CIGS-Molybdenum interface

Dielectric layers embedded between the CIGS absorber and Mo contact provide a barrier to minority carrier recombination if appropriate surface passivation can be achieved at CIGS/dielectric interfaces. Surface recombination velocities in the range of 100-10,000 cm s$^{-1}$ have been reported for alumina dielectric layers, and similar values could be expected with other oxides such as silica, see Refs. [8,24]. FIG. 5 panel a shows the illuminated J-V curve data for parametric variation of the surface recombination velocity at the CIGS/dielectric layer interface. It is seen that the $V_{oc}$ remains large up until about 1000 cm s$^{-1}$ and then drops monotonically for higher surface recombination velocities.

The $J_{SC}$ and efficiency follow the trend of the $V_{OC}$. If low surface recombination velocities can be achieved, a point contact scheme with a dielectric reflection layer would represent an attractive device design to increase both the $J_{SC}$ and $V_{OC}$. As for other materials systems, and also for CIGS, the importance of achieving good passivation at interfaces in very thin absorbers that utilize light trapping strategies becomes significant.

FIG. 5 panel b demonstrates that the passivation of dielectric layer interfaces in submicron thickness CIGS films is only required when a band offset exists between the CIGS and the Mo contact. With a small −0.2 eV offset, there is a 50 mV loss in $V_{OC}$ in randomly textured CIGS of 700 nm of equivalent planar thickness. A $V_{OC}$ of 651 mV is obtained for zero band offset, 659 mV for more positive offsets, and a maximum efficiency of 18.1% is achievable (these values are exemplary). A thin layer of $MoSe_2$ is sometimes used to create an indirect ohmic contact to Mo, but this has been reported to cause delamination issues in some cases, see Ref [23]. $MoSe_2$ is also known to be even more highly absorbing compared to Mo, see Ref. [36], which could introduce a significant loss mechanism in thin CIGS absorbers. Gallium grading has also been proposed to avoid minority carrier loss to the back contact, see Ref [35]. The value of $J_{SC}$ follows the open circuit voltage, as more carriers are collected at the junction. The fill factor remains relatively constant with varying surface recombination velocity.

Sparsely arrayed point contacts are the preferred design to simultaneously minimize surface recombination and enable the required majority carrier transport. It can be noted that majority carriers are collected at the back contact in this scheme, so the period of the point contacts can be on the order of the majority carrier diffusion length (or about 7.8 microns), and were 640 nm in width for randomly textured CIGS. Simulations with a zero band offset at the CIGS/Mo interface in samples with dielectric layers showed a still increasing $V_{OC}$, indicating that recombination is not negligible even for this point contact period. It can be observed that decreasing the contact opening could further enhance the passivation effect, but very small point contacts might be difficult to realize experimentally. The beneficial role of sodium ion diffusion through the Mo back contact can be noted, but incorporation of sodium fluoride into dielectric reflection layer has been reported before, see Ref. [24], and it is proposed herein that direct incorporate of Na$^+$ into a sol-gel silica layer could be suitable for patterning by nanoimprinting methods.

In the present disclosure, coupled optoelectronic simulations for light trapping and surface passivation in CIGS photovoltaics were described, indicating designs for performance to match or exceed that for thick planar absorbers. The best device architecture studied was a randomly textured CIGS absorber coupled with a dielectric passivation layer, for which a exemplary predicted efficiency of 18.2% is obtained. These devices had a planar absorber equivalent CIGS thickness of about 700 nm, outperforming a 3 μm absorber thickness in the planar configuration which was predicted to be 16.4% efficient. A combination of different light trapping strategies can be employed in these thin film devices, with the potential for enhancing the electronic performance also.

For randomly textured CIGS cells, the majority of light absorption occurs in the textured region, close to the junction. Long wavelength light is scattered giving a very flat, broadband absorption spectrum. Other light trapping strategies were examined, including dielectric reflection layers located between the CIGS absorber and Mo back contact.

These layers can be designed to preferentially reflect near band-gap light back into the absorber to reduce parasitic Mo absorption. Periodic dielectric structures can also give enhancement. Combining these two approaches can give absorption spectra characterized by superposition of these two different effects, demonstrating that multiple light trapping strategies can be used together. These optoelectronic models also addressed the other main challenge to submicron absorbers, namely, minority carrier recombination at the back contact. Dielectric reflection layers show the dual promise of surface passivation while enabling multi-pass absorption. Devices utilizing this design approach could result in improved CIGS photovoltaic efficiency with a significant reduction in absorber layer thickness, and corresponding reduction in material consumption and cost.

FIG. 5 panel a illustrates $V_{OC}$, $J_{SC}$, fill factor, and efficiency of simulated randomly textured devices with dielectric layers ($t_{Bulk}$=0 nm) that define point contacts for parametrically varied CIGS/SiO$_2$ interface surface recombination velocity. Panel b illustrates device performance without a dielectric interface, but with a varied band offset at the CIGS/Mo interface.

Figure 6:
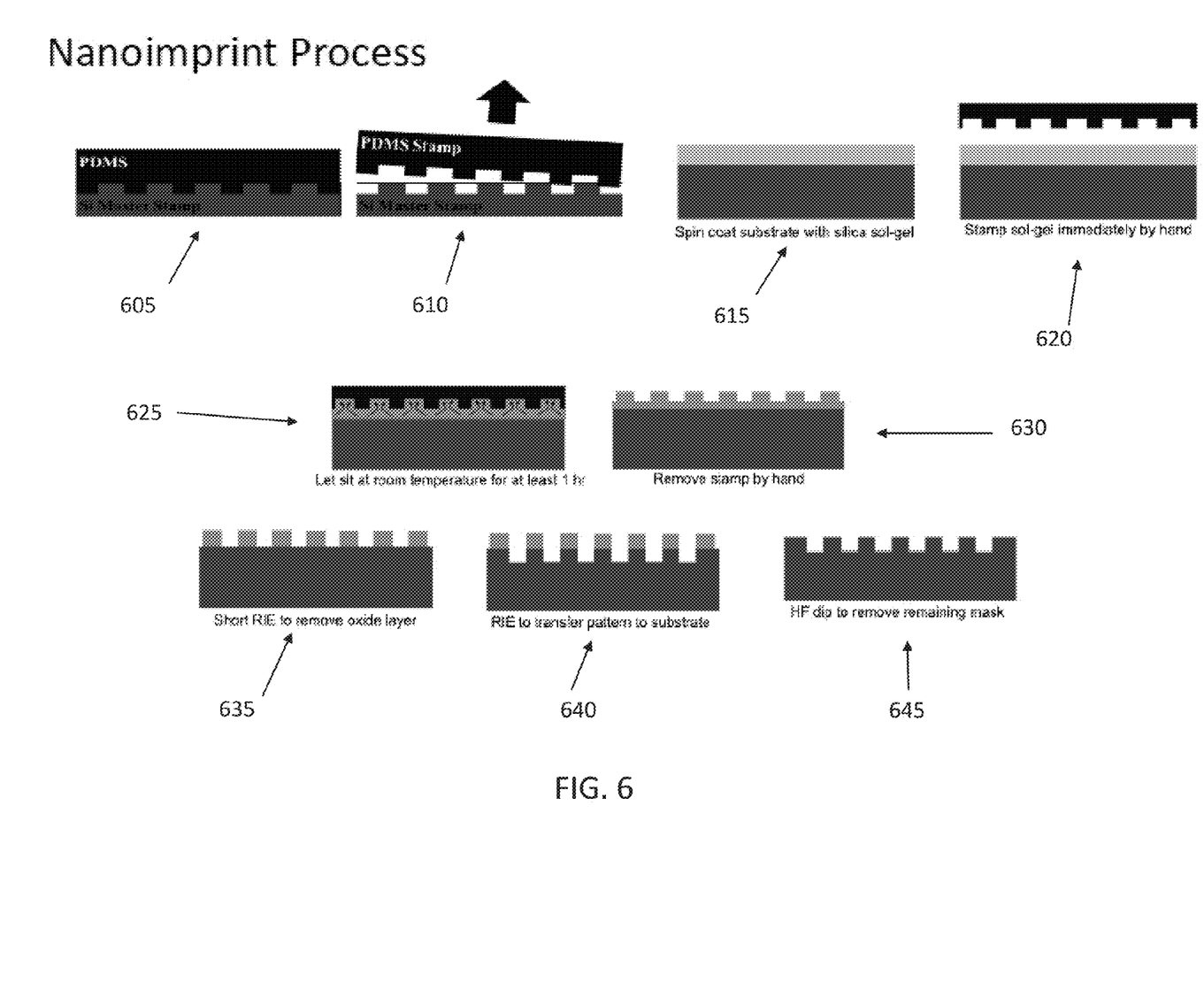
FIG. 6 illustrates an exemplary nanoimprint fabrication method.

In some embodiments, a nanoimprint process can be used to fabricate the structures of the present disclosure, for example as described in FIG. 6, starting with a PDMS or similar compliable polymer layer on a Si master stamp (605), followed by lifting of the polymer layer (610), spin coating of silica sol-gel (615), stamping the sol-gel (620), letting it dry (625), removing the stamp (630), removing the oxide layer with RIE ion etching (635), a further etching to transfer the pattern (640), and an HF dip to remove the mask (645).

In some embodiments, the photovoltaic structures will comprise: a metallic layer; a copper indium gallium diselenide (CIGS) layer on the metallic layer; a CdS layer on the CIGS layer, conformal to the CIGS layer; an Al-doped ZnO layer on the CdS layer. In some embodiments, the structure will be randomly or periodically structured, and may comprise void pockets surrounded by CdS layer and devoid of any material within. The oxide layer, for example silica, may be periodically structured, with a CIGS layer deposited conformally on the silica layer.

In some embodiments, the CIGS layer may be substituted with a Cu Zn Sn S (CZTS) layer or a CdTe layer. In some embodiments, a thickness of the silicon dioxide layer is optimized for enhancing light absorbtion and simultaneously for reducing back diffusion of charge carriers. In some embodiments, a grating may be used as a periodic structure instead of an array of pillars. In some embodiments, other dopants other than Na may be used for silica, for example Li or K. In some embodiments, the pillars have a height of between 1 nm-1000 nm, a width 10-1000 nm and a period of 11 nm-10 μm.

In some embodiments, the oxide layer is discontinuous, allowing direct contact between the metallic layer and the CIGS layer, as visible in FIG. 1, for example. A size and location of the discontinuous areas of the oxide layer can be optimized to reduce back diffusion of minority charge carriers. The silicon dioxide layer can comprise lithium, sodium or potassium dopants. A thickness of the silicon dioxide layer can be optimized for reducing absorption of photons in the metallic layer. A thickness of the silicon oxide layer can be further optimized for reflection of photons into the CIGS layer.

A number of embodiments of the disclosure have been described. Nevertheless, it will be understood that various modifications may be made without departing from the spirit and scope of the present disclosure. Accordingly, other embodiments are within the scope of the following claims.

The examples set forth above are provided to those of ordinary skill in the art as a complete disclosure and description of how to make and use the embodiments of the disclosure, and are not intended to limit the scope of what the inventor/inventors regard as their disclosure.

Modifications of the above-described modes for carrying out the methods and systems herein disclosed that are obvious to persons of skill in the art are intended to be within the scope of the following claims. All patents and publications mentioned in the specification are indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a," "an," and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

The references in the present application, shown in the reference list below, are incorporated herein by reference in their entirety.

REFERENCES

[1] Kelzenberg, M. D.; Boettcher, S. W.; Petykiewicz, J. A; Turner-Evans, D. B.; Putnam, M. C.; Warren, E. L.; Spurgeon, J. M.; Briggs, R. M.; Lewis, N. S.; Atwater, H. a. Enhanced Absorption and Carrier Collection in Si Wire Arrays for Photovoltaic Applications. Nat. Mater. 2010, 9, 368-368.

[2] Campbell, P.; Green, M. A. Light Trapping Properties of Pyramidally Textured Surfaces. J. Appl. Phys. 1987, 62, 243-249.

[3] Yablonovitch, E. Statistical Ray Optics. JOSA 1982, 72, 899.

[4] Deckman, H. W.; Wronski, C. R.; Witzke, H.; Yablonovitch, E. Optically Enhanced Amorphous Silicon Solar Cells. Appl. Phys. Lett. 1983, 42, 968-970.

[5] Müller, J.; Rech, B.; Springer, J.; Vanecek, M. TCO and Light Trapping in Silicon Thin Film Solar Cells. Sol. Energy 2004, 77, 917-930.

[6] Grandidier, J.; Weitekamp, R. a.; Deceglie, M. G.; Callahan, D. M.; Battaglia, C.; Bukowsky, C. R.; Ballif, C.; Grubbs, R. H.; Atwater, H. a. Solar Cell Efficiency Enhancement via Light Trapping in Printable Resonant Dielectric Nanosphere Arrays. Phys. Status Solidi 2013, 210, 255-260.

[7] Colin, C.; Massiot, I.; Cattoni, A.; Vandamme, N.; Dupuis, C.; Bardou, N.; Gerard, I.; Naghavi, N.; Guillemoles, J.-F.; Pelouard, J.-L.; et al. Broadband Light-Trapping in Ultra-Thin Nano-Structured Solar Cells. In; Freundlich, A.; Guillemoles, J.-F., Eds.; 2013; p. 86200C.

[8] van Lare, C.; Yin, G.; Polman, A.; Schmid, M. Light Coupling and Trapping in Ultrathin Cu(In,Ga)Se 2 Solar Cells Using Dielectric Scattering Patterns. ACS Nano 2015.

[9] Callahan, D.; Horowitz, K.; Atwater, H. Light Trapping in Ultrathin Silicon Photonic Crystal Superlattices with Randomly-Textured Dielectric Incouplers. Opt. Express 2013, 21, 4239-4245.

[10] Ferry, V. E.; Polman, A.; Atwater, H. a. Modeling Light Trapping in Nanostructured Solar Cells. ACS Nano 2011, 5, 10055-10064.

[11] Deceglie, M. G.; Ferry, V. E.; Alivisatos, A. P.; Atwater, H. A. Design of Nanostructured Solar Cells Using Coupled Optical and Electrical Modeling. Nano Lett. 2012, 12, 2894-2900.

[12] Li, X.; Hylton, N. P.; Giannini, V.; Lee, K.-H.; Ekins-Daukes, N. J.; Maier, S. A. Bridging Electromagnetic and Carrier Transport Calculations for Three-Dimensional Modelling of Plasmonic Solar Cells. Opt. Express 2011, 19 Suppl 4, A888-A896.

[13] Stanbery, B. J.; Sang, B.; Lu, D.; Miller, M.; Martinez, C.; Kim, M.; Moon, C.; Self-Assembled Nanostructures in Thin CIGS Absorber Films for Scalable High-Efficiency PV Module Manufacturing, Materials Research Society Presentation, Session W8.06, 2013.

[14] Abàmoff, M. D.; Magãlhaes, P. J.; Ram, S. J. Image Processing with imageJ. Biophotonics International, 2004, 11, 36-41.

[15] Lumerical Solutions, Inc. http://www.lumerical.com/tcad-products/fdtd/

[16] Alonso, M. I.; Garriga, M.; Durante Rinóon, C. a.; Hernández, E.; León, M. Optical Functions of Chalcopyrite CuGa X In 1-X Se 2 Alloys. Appl. Phys. A Mater. Sci. Process. 2002, 74, 659-664.

[17] "TCAD Sentaurus," [Online]. Available: http://www.synopsys.com

[18] Repins, I.; Glynn, S.; Duenow, J.; Coutts, T. J.; Metzger, W. K.; Contreras, M. A. Required Material Properties for High-Efficiency CIGS Modules. In; Delahoy, A. E.; Eldada, L. A., Eds.; 2009; p. 74090M-74090M-14.

[19] Dahan, N.; Jehl, Z.; Hildebrandt, T.; Greffet, J.-J.; Guillemoles, J.-F.; Lincot, D.; Naghavi, N. Optical Approaches to Improve the Photocurrent Generation in Cu(In,Ga)Se2 Solar Cells with Absorber Thicknesses down to 0.5 Mm. J. Appl. Phys. 2012, 112, 094902.

[20] Gloeckler, M.; Fahrenbruch, A. L.; Sites, J. R. Numerical Modeling of CIGS and CdTe Solar Cells: Setting the Baseline. In Proceedings of 3rd World Conference onPhotovoltaic Energy Conversion; IEEE, 2003; pp. 491-494.

[21] Contreras, M. a.; Romero, M. J.; To, B.; Hasoon, F.; Noufi, R.; Ward, S.; Ramanathan, K. Optimization of CBD CdS Process in High-Efficiency Cu(In,Ga)Se2-Based Solar Cells. In Thin Solid Films; 2002; Vol. 403-404, pp. 204-211.

[22] Naghavi, N.; Abou-Ras, D.; Allsop, N.; Barreau, N.; Bücheler, S.; Ennaoui, A.; Fischer, C. H.; Guillen, C.; Hariskos, D.; Herrero, J.; et al. Buffer Layers and Transparent Conducting Oxides for Chalcopyrite Cu(In,Ga)(S, Se)2 Based Thin Film Photovoltaics: Present Status and Current Developments. Prog. Photovoltaics Res. Appl. 2010, 18, 411-433.

[23] Stanbery, B. J. Copper Indium Selenides and Related Materials for Photovoltaic Devices. Crit. Rev. Solid State Mater. Sci. 2002, 27, 73-117.

[24] Vermang, B.; Fjällstrom, V.; Pettersson, J.; Salomé, P.; Edoff, M. Development of Rear Surface Passivated Cu(In, Ga)Se2 Thin Film Solar Cells with Nano-Sized Local Rear Point Contacts. Sol. Energy Mater. Sol. Cells 2013, 117, 505-511.

[25] Verschuuren, M. A. Substrate Conformal Imprint Lithography for Nanophotonics, Utrecht University, 2010.

[26] Verschuuren, M.; Sprang, H. 3D Photonic Structures by Sol-Gel Imprint Lithography. MRS Proc. 2007, 1002, 1-6.

[27] Kelzenberg, M. D. Appendix B: Silicon Microwire Photovoltaics, California Institute of Technology, 2010.

[28] van Lare, C.; Lenzmann, F.; Verschuuren, M. a.; Polman, A. Dielectric Scattering Patterns for Efficient Light Trapping in Thin-Film Solar Cells. Nano Lett. 2015, 150630085420008.

[29] Wang, P.; Menon, R. Optimization of Periodic Nanostructures for Enhanced Light-Trapping in Ultra-Thin Photovoltaics. Opt. Express 2013, 21, 6274.

[30] Du, Q. G.; Kam, C. H.; Demir, H. V.; Yu, H. Y.; Sun, X. W. Enhanced Optical Absorption in Nanopatterned Silicon Thin Films with a Nano-Cone-Hole Structure for Photovoltaic Applications. Opt. Lett. 2011, 36, 1713.

[31] Oskooi, A.; Favuzzi, P. a.; Tanaka, Y.; Shigeta, H.; Kawakami, Y.; Noda, S. Partially Disordered Photonic-Crystal Thin Films for Enhanced and Robust Photovoltaics. Appl. Phys. Lett. 2012, 100, 181110.

[32] Ji, L.; Nam, W. J.; Fonash, S. Highly Ordered Nano-Cone Back Reflector Arrays for Ultra-Thin High Performance CIGS Cells. In 2013 IEEE 39th Photovoltaic Specialists Conference (PVSC); IEEE, 2013; pp. 1977-1979.

[33] Yang, L.; Mo, L.; Okuno, Y.; He, S. Optimal Design of Ultra-broadband, Omnidirectional, and Polarization-insensitive Amorphous Silicon Solar Cells with a Core-shell Nanograting Structure. Prog. Photovoltaics . . . 2013, 1077-1086.

[34] Fountaine, K. T.; Atwater, H. a. Mesoscale Modeling of Photoelectrochemical Devices: Light Absorption and Carrier Collection in Monolithic, Tandem, Si|WO_3 Microwires. Opt. Express 2014, 22, A1453.

[35] Gloeckler, M.; Sites, J. R. Potential of Submicrometer Thickness Cu(In,Ga)Se[sub 2] Solar Cells. J. Appl. Phys. 2005, 98, 103703.

[36] M. Bernardi, M. Palummo, J. C. Grossman, Extraordinary Sunlight Absorption and One Nanometer Thick Photovoltaics Using Two-Dimensional Monolayer Materials, Nano Lett. 13 (2013) 3664-3670. doi:10.1021/nl401544y.

What is claimed is:

1. A photovoltaic structure comprising:
a metallic layer;
a copper indium gallium diselenide (CIGS) layer on the metallic layer;
a CdS layer on the CIGS layer, conformal to the CIGS layer;
an Al-doped ZnO layer on the CdS layer; and
an oxide layer between the metallic layer and the CIGS layer, the oxide layer comprising a plurality of discontinuities allowing direct contact between the metallic layer and the CIGS layer, and a plurality of regions comprising an array of oxide pillars on a planar oxide layer,
wherein:
the CIGS layer is conformally deposited onto the array of oxide pillars,
a size and location of the discontinuities are configured to reduce back diffusion of minority charge carriers, a thickness of the planar oxide layer and a thickness of the oxide pillars are configured to reduce absorption of photons in the metallic layer and increasing reflection of photons into the CIGS layer, and wherein the oxide layer is silicon dioxide comprising lithium, sodium, or potassium dopants.

2. The photovoltaic structure of claim 1, wherein the CIGS layer is randomly textured and comprises lobes, and further comprising void pockets entirely surrounded by the CdS layer and devoid of any material within, the void pockets being located directly underneath corresponding lobes.

3. The photovoltaic structure of claim 2, wherein the lobes are low Q resonators.

4. The photovoltaic structure of claim 1, further comprising:
    void pockets entirely surrounded by the CdS layer and devoid of any material within.

5. The photovoltaic structure of claim 1, wherein the metallic layer is Mo.

6. The photovoltaic structure of claim 1, wherein the oxide layer is a periodic structure.

7. The photovoltaic structure of claim 1, wherein the structure is fabricated by nanoimprint lithography.

8. The photovoltaic structure of claim 7, wherein the oxide pillars have a height of between 1 nm-1000 nm, and a width of between 10-1000 nm and a distance between pillars of between 11 nm-10 μm.

\* \* \* \* \*